(12) United States Patent
Zhao et al.

(10) Patent No.: US 11,957,022 B2
(45) Date of Patent: Apr. 9, 2024

(54) DISPLAY PANEL HAVING INTRA-SUBSTRATE FILLER CONFIGURATION, METHOD OF MANUFACTURING SUCH A DISPLAY PANEL, AND DISPLAY DEVICE

(71) Applicant: BOE TECHNOLOGY GROUP CO., LTD., Beijing (CN)

(72) Inventors: Dejiang Zhao, Beijing (CN); Wei Huang, Beijing (CN); Yang Li, Beijing (CN); Yu Tian, Beijing (CN); Tianhao Lu, Beijing (CN); Qian Jin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 431 days.

(21) Appl. No.: 17/304,777

(22) Filed: Jun. 25, 2021

(65) Prior Publication Data

US 2022/0157891 A1     May 19, 2022

(30) Foreign Application Priority Data

Nov. 17, 2020   (CN) .......................... 202011289210.9

(51) Int. Cl.
| | | |
|---|---|---|
| H10K 59/38 | (2023.01) |
| H01L 25/16 | (2023.01) |
| H10K 50/858 | (2023.01) |
| H10K 50/86 | (2023.01) |
| H10K 59/12 | (2023.01) |
| H10K 71/00 | (2023.01) |

(52) U.S. Cl.
CPC .......... *H10K 59/38* (2023.02); *H01L 25/167* (2013.01); *H10K 50/858* (2023.02); *H10K 50/865* (2023.02); *H10K 71/00* (2023.02); *H10K 59/12* (2023.02)

(58) Field of Classification Search
None
See application file for complete search history.

(56) References Cited

U.S. PATENT DOCUMENTS

| | | | | |
|---|---|---|---|---|
| 2020/0161579 A1* | 5/2020 | Kim | ........................ | H10K 59/38 |
| 2021/0074770 A1* | 3/2021 | Choe | .................... | G02B 5/0242 |
| 2021/0399068 A1* | 12/2021 | Kim | ..................... | H10K 59/353 |
| 2022/0199695 A1* | 6/2022 | Takiguchi | ................. | G09F 9/30 |

\* cited by examiner

*Primary Examiner* — Nduka E Ojeh
(74) *Attorney, Agent, or Firm* — Kinney & Lange, P.A.

(57) ABSTRACT

A display panel includes a first base substrate, a plurality of light sources on the first base substrate, a second base substrate opposite to the first base substrate, a light conversion structure on the second base substrate, a plurality of extinction structures on a side of the light conversion structure facing the first base substrate, a first channel formed between any two adjacent extinction structures, a plurality of first optical structures on a side of the light conversion structure facing the first base substrate, wherein the plurality of first optical structures are respectively located in the first channels each between any two adjacent extinction structures, and a filler portion between the plurality of light sources and the plurality of first optical structures. The filler portion contains a material with a refractive index greater than that of a material of the first optical structure, and the extinction structure contains light-absorbing material.

20 Claims, 10 Drawing Sheets

DISPLAY PANEL HAVING INTRA-SUBSTRATE FILLER CONFIGURATION, METHOD OF MANUFACTURING SUCH A DISPLAY PANEL, AND DISPLAY DEVICE

CROSS REFERENCE

This application claims the benefit of Chinese Patent Application No. 202011289210.9 filed on Nov. 17, 2020 in the State Intellectual Property Office of China, the whole disclosure of which is incorporated herein by reference.

TECHNICAL FIELD

The present disclosure relates to a field of display technology, and in particular to a display panel, a method of manufacturing a display panel, and a display device.

BACKGROUND

Light emitting diode (LED) has advantages of low power consumption and high brightness, and photoluminescence quantum dot (QD) material has advantages of wide color gamut and pure light color. Therefore, display technology based on LED+QD structure has gradually become one of the research hotspots.

In this kind of display technology, red and green photoluminescence QD materials may generally be excited by blue light emitted by the LED, so as to achieve a full-color display.

SUMMARY

In order to solve at least one aspect of the problems described above, the embodiments of the present disclosure provide a display panel, a method of manufacturing a display panel, and a display device.

In one aspect, there is provided a display panel, including:
a first base substrate;
a plurality of light sources on the first base substrate;
a second base substrate opposite to the first base substrate;
a light conversion structure on the second base substrate, wherein the light conversion structure includes at least a plurality of quantum dot structures;
a plurality of extinction structures on a side of the light conversion structure facing the first base substrate, wherein a first channel is formed between any two adjacent extinction structures;
a plurality of first optical structures on the side of the light conversion structure facing the first base substrate, wherein the plurality of first optical structures are respectively located in the first channels each between any two adjacent extinction structures; and
a filler portion between the first base substrate and the second base substrate, wherein the filler portion is located between the plurality of light sources and the plurality of first optical structures,
wherein the filler portion contains a material with a refractive index greater than that of a material of the first optical structure, and the extinction structure contains a light-absorbing material; and
wherein orthographic projections of the plurality of light sources on the first base substrate at least partially overlap orthographic projections of the plurality of first optical structures on the first base substrate, an orthographic projection of the light conversion structure on the first base substrate at least partially overlaps the orthographic projections of the plurality of first optical structures on the first base substrate, and the orthographic projections of the plurality of first optical structures on the first base substrate fall within an orthographic projection of the filler portion on the first base substrate.

According to some exemplary embodiments, the display panel further includes an extinction layer on the first base substrate, wherein the extinction layer contains a light-absorbing material, the extinction layer is located on a side of the plurality of light sources facing the second base substrate, and an orthographic projection of each light source on the first base substrate is surrounded by the orthographic projection of the extinction layer on the first base substrate.

According to some exemplary embodiments, the display panel further includes a light source protection layer on the first base substrate, wherein the light source protection layer is located on the side of the light source facing the second base substrate, and an orthographic projection of the light source protection layer on the first base substrate covers the orthographic projection of the light source on the first base substrate; and the light source protection layer contains a material with a refractive index smaller than that of the material of the filler portion.

According to some exemplary embodiments, the display panel further includes a plurality of light blocking structures on the second base substrate, wherein the plurality of light blocking structures are located between a layer where the extinction structure is located and a layer where the light conversion structure is located; and the light blocking structure contains a light blocking material, a second channel is formed between any two adjacent light blocking structures, and an orthographic projection of the second channel on the second base substrate falls within an orthographic projection of the first channel on the second base substrate, and a plurality of first channels and a plurality of second channels are respectively connected to form a plurality of light inlet channels.

According to some exemplary embodiments, the display panel further includes a plurality of quantum dot protection structures on the second base substrate, wherein the plurality of quantum dot protection structures are located between the light conversion structure and the first optical structure, and orthographic projections of the plurality of quantum dot protection structures on the second base substrate are respectively located within orthographic projections of the plurality of second channels on the second base substrate.

According to some exemplary embodiments, the display panel further includes a plurality of barrier wall structures on the second base substrate, wherein the plurality of barrier wall structures are located between the second base substrate and the plurality of extinction structures, and orthographic projections of the plurality of barrier wall structures on the second base substrate are respectively located within orthographic projections of the plurality of extinction structures on the second base substrate.

According to some exemplary embodiments, a pixel opening is formed between any two adjacent barrier wall structures, orthographic projections of a plurality of the pixel openings on the first base substrate respectively cover orthographic projections of the plurality of light inlet channels on the first base substrate, and orthographic projections of the plurality of pixel openings on the first base substrate respectively cover orthographic projections of the plurality of light sources on the first base substrate.

According to some exemplary embodiments, a ratio of the refractive index of the material of the filler portion to the refractive index of the material of the first optical structure is in a range of 1.1 to 1.5; and/or, a ratio of the refractive index of the material of the filler portion to the refractive index of the material of the light source protection layer is in a range of 1.1 to 1.5; and/or, the quantum dot protection structure contains a material with a refractive index substantially equal to that of the material of the first optical structure.

According to some exemplary embodiments, an orthographic projection of each light inlet channel on the first base substrate has an area of 80%~90% of an area of an orthographic projection of a pixel opening covering the each light inlet channel on the first base substrate.

According to some exemplary embodiments, a surface of the extinction layer facing the second base substrate is closer to the second base substrate than a surface of the light source facing the second base substrate, so as to allow the extinction layer to absorb at least a part of a light ray emitted from the light source and having an exit angle greater than a first specified angle.

According to some exemplary embodiments, a surface of the filler portion facing the second base substrate is in contact with a surface of the first optical structure away from the second base substrate; and/or, a surface of the filler portion away from the second base substrate is in contact with a surface of the light source protection layer away from the first base substrate.

According to some exemplary embodiments, a thickness of the extinction structure is designed such that a part of a light ray refracted at an interface between the filler portion and the first optical structure is absorbed by the extinction structure, wherein the part of the light ray has an exit angle greater than a second specified angle, and the extinction structure has a thickness between 8 microns and 15 microns.

According to some exemplary embodiments, the filler portion has a thickness between 3 microns and 8 microns; and/or the light blocking structure has a thickness between 0.5 microns and 2 microns; and/or the extinction layer has a thickness between 2 microns and 3 microns; and/or the light source protection layer has a thickness between 500 nanometers and 1000 nanometers; and/or the quantum dot protection structure has a thickness between 500 nanometers and 1000 nanometers; and/or the barrier wall structure 60 has a thickness between 6 microns and 15 microns.

According to some exemplary embodiments, the pixel opening includes a first sub-pixel opening and a second sub-pixel opening, and the plurality of quantum dot structures include a first quantum dot structure configured to convert light with a third range of wavelength incident thereon into light with a first range of wavelength and a second quantum dot structure configured to convert light with the third range of wavelength incident thereon into light with a second range of wavelength, and the first range of wavelength, the second range of wavelength and the third range of wavelength are different from each other; the first quantum dot structure is located in the first sub-pixel opening, and the second quantum dot structure is located in the second sub-pixel opening, and the pixel opening further includes a third sub-pixel opening, and the display panel further includes scattering particles provided in the third sub-pixel opening According to some exemplary embodiments, the plurality of light sources include a plurality of mini light emitting diodes or a plurality of micro light emitting diodes.

According to some exemplary embodiments, the display panel further includes: a pixel driving circuit layer on the first base substrate, wherein the pixel driving circuit layer includes a plurality of thin film transistors including at least a driving transistor; and a plurality of pad groups on a side of the pixel driving circuit layer facing the second base substrate, wherein each of the pad groups includes a first pad electrically connected to a source electrode or a drain electrode of the driving transistor and a second pad electrically connected to a power supply negative electrode of the display panel; the plurality of light sources are located on a side of the pad group facing the second base substrate, and each light source includes a first pin electrically connected to the first pad and a second pin electrically connected to the second pad.

According to some exemplary embodiments, the plurality of light sources include a plurality of organic light emitting diodes.

According to some exemplary embodiments, the display panel further includes: a pixel driving circuit layer on the first base substrate, wherein the pixel driving circuit layer includes a plurality of thin film transistors including at least a driving transistor; and a plurality of organic light emitting diodes on a side of the pixel driving circuit layer facing the second base substrate, wherein the organic light emitting diode includes an anode electrode on the side of the pixel driving circuit layer facing the second base substrate, an organic light emitting layer on a side of the anode electrode facing the second base substrate, and a cathode electrode on a side of the organic light emitting layer facing the second base substrate.

In another aspect, there is provided a display device, including the display panel described above.

In yet another aspect, there is provided a method of manufacturing a display panel, including:

forming a first substrate, including forming a plurality of light sources on a first base substrate;

forming a second substrate, including: forming a light conversion structure on a second base substrate, wherein the light conversion structure includes at least a plurality of quantum dot structures; forming a plurality of extinction structures on a side of the light conversion structure away from the second substrate by a patterning process, wherein a first channel is formed between any two adjacent extinction structures; and forming a plurality of first optical structures on the side of the light conversion structure away from the second base substrate and in the plurality of first channels by a printing process;

aligning the first substrate and the second substrate; and forming a filler portion between the first substrate and the second substrate, wherein the filler portion contains a material with a refractive index greater than that of a material of the first optical structure, and the extinction structure contains a light-absorbing material; and wherein orthographic projections of the plurality of light sources on the first base substrate at least partially overlap orthographic projections of the plurality of first optical structures on the first base substrate, an orthographic projection of the light conversion structure on the first base substrate at least partially overlaps the orthographic projections of the plurality of first optical structures on the first base substrate, and the orthographic projections of the plurality of first optical structures on the first base substrate fall within an orthographic projection of the filler portion on the first base substrate.

BRIEF DESCRIPTION OF THE DRAWINGS

With the following description of the present disclosure with reference to the drawings, other objectives and advantages of the present disclosure would be obvious, which facilitates a comprehensive understanding of the present disclosure.

Figure 1:
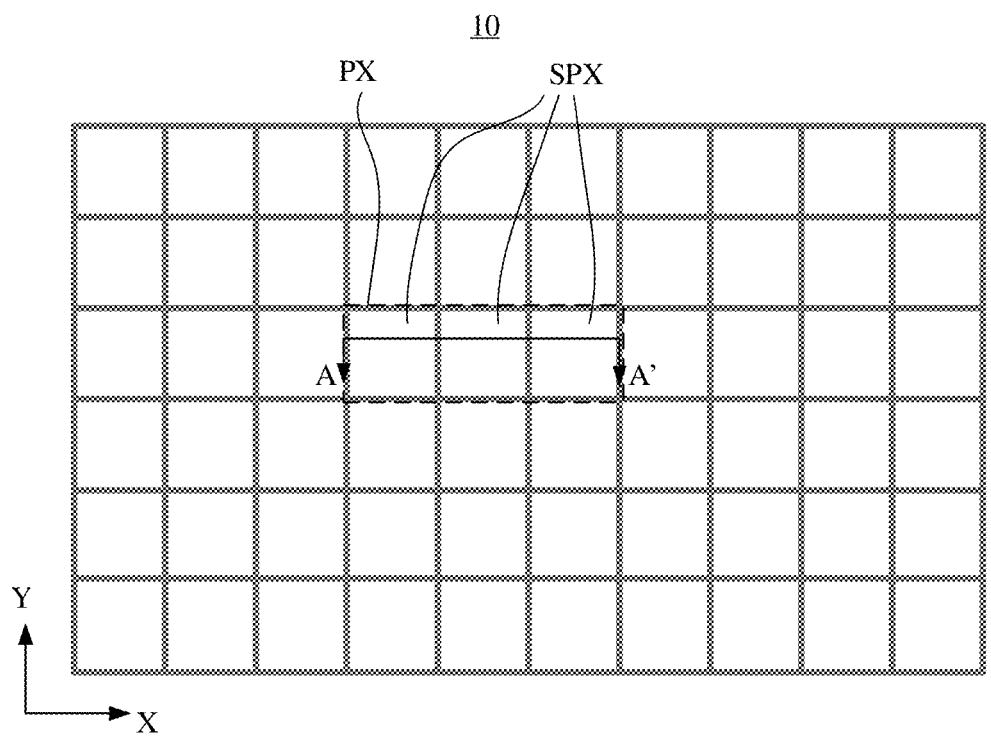
FIG. 1 shows a schematic plan view of a display panel according to some embodiments of the present disclosure.

It should be noted that for the sake of clarity, in the drawings used to describe the embodiments of the present disclosure, sizes of layers, structures or areas may be enlarged or reduced, that is, these drawings are not drawn according to actual scale.

DETAILED DESCRIPTION OF EMBODIMENTS

The technical solutions of the present disclosure will be further described in detail below through the embodiments and in conjunction with the drawings. In the specification, the same or similar reference numerals indicate the same or similar components. The following description of the embodiments of the present disclosure with reference to the drawings is intended to explain a general inventive concept of the present disclosure, and should not be understood as a limitation of the present disclosure.

In addition, in the following detailed description, for ease of explanation, many specific details are set forth to provide a comprehensive understanding of the embodiments of the present disclosure. Obviously, however, one or more embodiments may also be implemented without these specific details.

It should be noted that "on", "formed on" and "arranged on" mentioned herein may mean that a layer is directly formed or arranged on another layer, or mean that a layer is indirectly formed or arranged on another layer, that is, there may be other layers between the two layers.

It should be noted that although terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

When a component (such as a first component) is connected or electrically connected to another component (such as a second component), it should be understood that the component is directly connected or electrically connected to the another component or connected or electrically connected to the another component through any other component (such as a third component). On the other hand, when a component (such as a first component) is described as being "directly connected to", "directly coupled to" or "directly electrically connected to" another component (such as a second component), it may be understood that there is no other component (such as a third component) between the components.

Here, an XYZ coordinate system is used to describe relative positional relationships between various features in the embodiments of the present disclosure. It should be understood that X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ.

In the present disclosure, unless otherwise specified, the expression "patterning process" generally includes steps of photoresist coating, exposure, development, etching, and photoresist stripping, etc. The expression "one-time patterning process" means a process of forming patterned layers, components, members and so on by using one mask.

It should be noted that the expression "thickness" used herein refers to a size in a light exit direction of the display panel. The expression "width" refers to a size in a direction perpendicular to the light exit direction of the display panel and parallel to a row direction of a pixel array on the display panel (that is, X direction shown).

Herein, the inorganic light emitting diode refer to a light emitting element made of an inorganic material, and LED refers to an inorganic light emitting element that is different from the OLED. Specifically, the inorganic light emitting diode may include a Mini Light Emitting Diode (Mini LED)

and a Micro Light Emitting Diode (Micro LED). The micro light emitting diode (that is, the Micro LED) refers to an ultra-small light emitting diode with a grain size of less than 100 microns, and the mini light emitting diode (that is, the Mini LED) refers to a small light emitting diode with a grain size between that of the Micro LED and that of a traditional LED. For example, the grain size of the Mini LED may range from 100 microns to 300 microns, and the grain size of the Micro LED may range from 10 microns to 100 microns.

In a display panel using photoluminescence quantum dots, there is usually a certain gap between a backlight source of the display panel and a layer where the photoluminescence quantum dots are located. Generally, the gap is greater than 10 μm. In this case, although a black matrix and a barrier wall structure may be provided to block light between adjacent pixels, it is still difficult to avoid color mixture of light of different pixels.

Embodiments of the present disclosure provide a display panel, a method of manufacturing a display panel, and a display device. The display panel includes a first substrate, a second substrate opposite to the first substrate, and a filler portion between the first substrate and the second substrate. The first substrate includes a first base substrate and a plurality of light sources on the first base substrate. The second substrate includes: a second base substrate; a light conversion structure on the second base substrate and the light conversion structure includes at least a plurality of quantum dot structures; a plurality of extinction structures on a side of the light conversion structure facing the first substrate; and a plurality of first optical structures on a side of the light conversion structure facing the first substrate. A first channel is formed between any two adjacent extinction structures, and the plurality of first optical structures are respectively located in the first channels between any two adjacent extinction structures. The filler portion contains a material with a refractive index greater than that of a material of the first optical structure, and the extinction structure contains a light-absorbing material. Orthographic projections of the plurality of light sources on the first base substrate at least partially overlap orthographic projections of the plurality of first optical structures on the first base substrate, an orthographic projection of the light conversion structure on the first base substrate at least partially overlaps the orthographic projections of the plurality of first optical structures on the first base substrate, and the orthographic projections of the plurality of first optical structures on the first substrate fall within an orthographic projection of the filler portion on the first base substrate. In the display panel provided by the embodiments of the present disclosure, a collimated light ray (that is, a light ray with an exit angle less than a specified angle) emitted from the light source may excite a quantum dot structure, so as to achieve a normal color display. A non-collimated light ray (that is, a light ray with an exit angle greater than the specified angle) emitted from the light source may be blocked or absorbed to prevent the non-collimated light ray from exciting the quantum dots in neighboring pixels, so as to avoid cross-color of pixels. In addition, light scattered by scattered particles in the quantum dots may be prevented from returning to the light source, thereby avoiding a light crosstalk.

Figure 2:
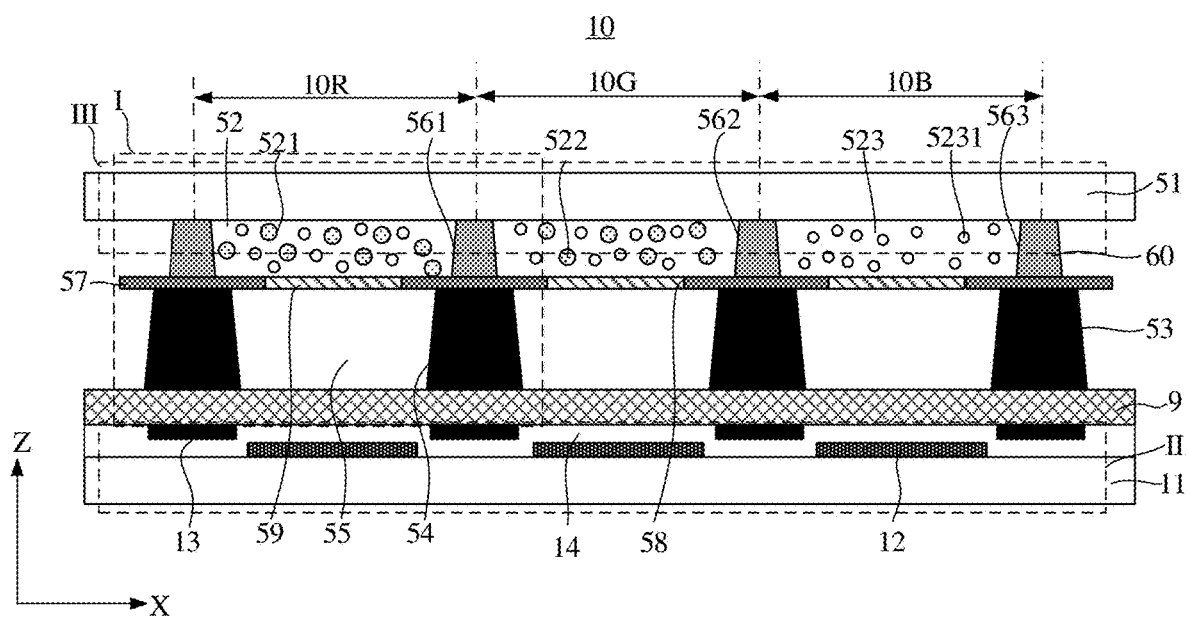
FIG. 2 shows a schematic cross-sectional view of a display panel taken along line AA' in FIG. 1 according to some embodiments of the present disclosure.

FIG. 1 shows a schematic plan view of a display panel according to some embodiments of the present disclosure. FIG. 2 shows a cross-sectional view of a display panel taken along line AA' in FIG. 1 according to some embodiments of the present disclosure.

Referring to FIG. 1 and FIG. 2, a display panel 10 according to the embodiments of the present disclosure may include a first substrate 1 and a second substrate 5 opposite to the first substrate 1. For example, the first substrate 1 may be a substrate provided with components such as a light source and other components, and the second substrate 5 may be a substrate provided with a color filter and other components.

The first substrate 1 may include a first base substrate 11 and a plurality of light sources 12 on the first base substrate 11.

The second substrate 5 may include: a second base substrate 51; a light conversion structure 52 on the second base substrate 51 and the light conversion structure includes at least a plurality of quantum dot structures; a plurality of extinction structures 53 on a side of the light conversion structure 52 facing the first substrate 1; and a plurality of first optical structures 55 on a side of the light conversion structure 52 facing the first substrate 1. A first channel 54 is formed between any two adjacent extinction structures 53, and the plurality of first optical structures 55 are respectively located in the first channels 54 between any two adjacent extinction structures 53.

The display panel 10 may further include a filler portion 9 between the first substrate 1 and the second substrate 5.

In the embodiments of the present disclosure, the filler portion 9 contains a material with a refractive index greater than that of a material of the first optical structure 55, and the extinction structure 53 contains a light-absorbing material.

As shown in FIG. 1, orthographic projections of the plurality of light sources 12 on the first base substrate 11 at least partially overlap orthographic projections of the plurality of first optical structures 55 on the first base substrate 11, an orthographic projection of the light conversion structure 52 on the first base substrate 11 at least partially overlaps the orthographic projections of the plurality of first optical structures 55 on the first base substrate 11, and the orthographic projections of the plurality of first optical structures 55 on the first base substrate 11 falls within an orthographic projection of the filler portion 9 on the first base substrate 11.

Figure 3:
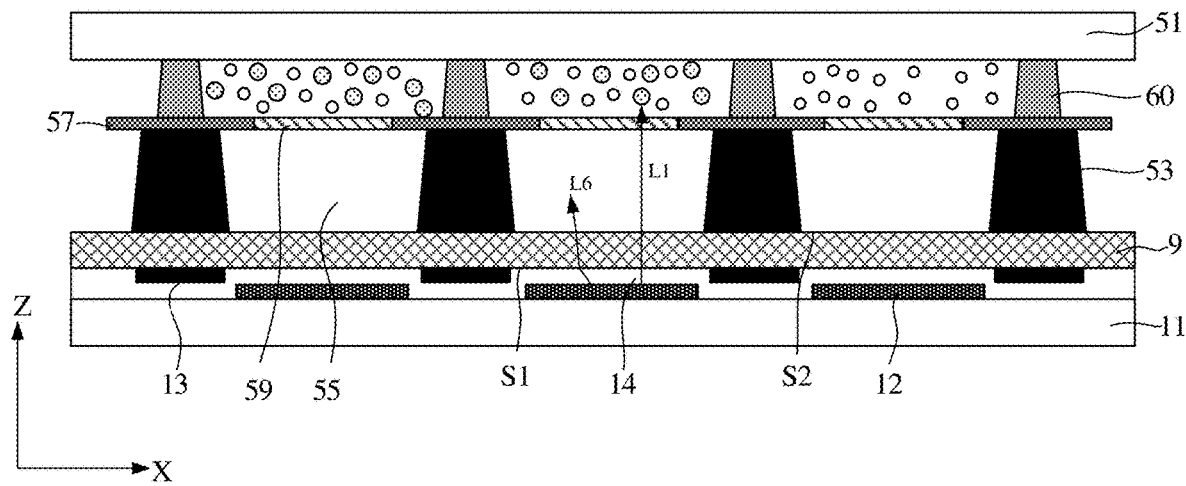
FIG. 3 and FIG. 4 respectively show schematic cross-sectional views of a display panel taken along line AA' in FIG. 1 according to some embodiments of the present disclosure, in which a light path diagram of light rays with various exit angles emitted from a light source is schematically shown.
Figure 4:
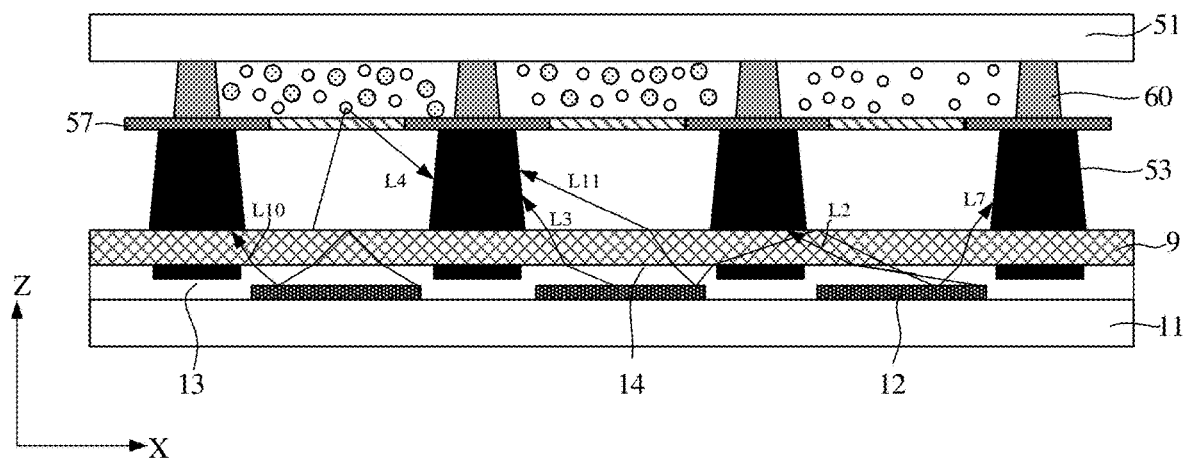

FIG. 3 and FIG. 4 respectively show schematic cross-sectional views of a display panel taken along line AA' in FIG. 1 according to some embodiments of the present disclosure, in which a light path diagram of light rays with various exit angles emitted from a light source is schematically shown. As shown in FIG. 3 and FIG. 4, a collimated light ray (that is, a light ray with an exit angle less than a specified angle, such as a light ray L1 shown in FIG. 3) emitted from the light source 12 may excite a quantum dot structure through the filler portion 9 and the first optical structure 55, so as to achieve a normal color display. A non-collimated light ray (that is, a light ray with an exit angle greater than the specified angle, such as a light ray L2 and a light ray L3 shown in FIG. 4) emitted from the light source 12 may be blocked or absorbed to prevent the non-collimated light ray from exciting the quantum dots in neighboring pixels, so as to avoid cross-color of pixels. In addition, light scattered by the scattered particles in the quantum dots (such as a light ray L4 shown in FIG. 4) may be prevented from returning to the light source, thereby avoiding a light crosstalk.

In the embodiments of the present disclosure, the first base substrate 11 and the second base substrate 51 may be rigid substrates or flexible substrates, including but not limited to glass substrates or polyimide (PI) substrates.

In the embodiments of the present disclosure, the plurality of light sources 12 may include a plurality of organic light emitting diodes or a plurality of inorganic light emitting diodes, such as Mini LEDs or Micro LEDs.

In the embodiments of the present disclosure, referring to FIG. 1 and FIG. 2 in combination, the display panel 10 may include a plurality of pixels PX, for example, an area surrounded by a dashed frame. It should be understood that the plurality of pixels PX may be arranged in an array, that is, including a plurality of rows and a plurality of columns. In FIG. 1, only a part of the pixels of the display panel 10, rather than all the pixels, are schematically shown. In FIG. 1, a horizontal direction may be referred to as a row direction, and a vertical direction may be referred to as a column direction. Each pixel PX may include a plurality of sub-pixels SPX for emitting light of different colors, such as red color, green color, blue color, yellow color and other different colors, so as to achieve a color display. For example, the display panel according to the embodiments of the present disclosure may include at least three sub-pixels SPX. For example, the three sub-pixels SPX may include a first sub-pixel 10R for emitting light with a first range of wavelength, a second sub-pixel 10G for emitting light with a second range of wavelength, and a third sub-pixel 10B for emitting light with a third range of wavelength.

In the embodiments of the present disclosure, each sub-pixel may include a sub-pixel opening. For example, the first sub-pixel 10R may include a first sub-pixel opening 561, the second sub-pixel 10G may include a second sub-pixel opening 562, and the third sub-pixels 10B may include a third sub-pixel opening 563.

It should be noted that, in FIG. 1, in order to clearly show images such as a dashed frame and a section line, a black matrix is shown with a gray line, but this should not be regarded as a limitation of the embodiments of the present disclosure.

Herein, unless otherwise specified, the first range of wavelength, the second range of wavelength and the third range of wavelength are different from each other. For example, the first range of wavelength, the second range of wavelength and the third range of wavelength may correspond to a first color, a second color, and a third color, respectively. For another example, the first color, the second color and the third color may refer to red, green and blue, respectively. Certainly, the display panel may further include pixels for emitting light of other colors, such as pixels for emitting yellow light, and this is not particularly limited in the embodiments of the present disclosure.

For example, the light conversion structure 52 may include a plurality of quantum dot structures for emitting light of different colors. For example, the first sub-pixel 10R may include a first quantum dot structure 521 for emitting the light with the first range of wavelength, and the second sub-pixel 10G may include a second quantum dot structure 522 for emitting the light with the second range of wavelength. Certainly, the light conversion structure 52 may further include a quantum dot structure for emitting light with other range of wavelengths, for example, a quantum dot structure for emitting yellow light.

Herein, the expression "quantum dot (QD)" is a semiconductor nanostructure that binds excitons in three spatial directions. Those skilled in the art should understand that the quantum dot has following characteristics. When excited by light with a predetermined wavelength, the quantum dot may convert the light with the predetermined wavelength into light with another predetermined wavelength, and the converted light with the another predetermined wavelength may be determined by factors such as a material of the quantum dot, a shape of the quantum dot, a size of the quantum dot, etc.

For example, the first quantum dot structure 521 may be used to convert the light with the third range of wavelength (for example, blue light) incident thereon into the light with the first range of wavelength (for example, red light), and the second quantum dot structure 522 may be used to convert the light with the third range of wavelength (for example, blue light) incident thereon into the light with the second range of wavelength (for example, green light).

It should also be understood that, herein, a quantum dot structure may include a plurality of quantum dots. For example, the first quantum dot structure 521 may include a plurality of first quantum dots 521, and each first quantum dot 521 may be used to convert the light of the third color incident thereon into the light of the first color. The second quantum dot structure 522 may include a plurality of second quantum dots 522, and each second quantum dot 522 may be used to convert the light of the third color incident thereon into the light of the second color.

For example, a material of the quantum dot may be a quantum dot material commonly used in the art, including but not limited to one or more selected from CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, AlSb. Certainly, the materials of the quantum dot include but are not limited to those listed above, and other materials that are the same as or similar to the above substances may also be used. Those skilled in the art should also understand that an emission spectrum of the quantum dot may be controlled by changing a size of the quantum dot. That is, by forming the quantum dot into different sizes, the light of different colors may be emitted. Taking a zinc sulfide (ZnS) quantum dot as an example, the quantum dot for emitting red light mainly has a size of about 9-10 nm, the quantum dot for emitting yellow light has a size of about 8 nm, and the quantum dot for emitting green light has a size of about 7 nm.

For example, the plurality of first quantum dots 521 may be respectively arranged in the plurality of first sub-pixel openings 561, and the plurality of second quantum dots 522 may be respectively arranged in the plurality of second sub-pixel openings 562.

In some exemplary embodiments of the present disclosure, referring to FIG. 2 to FIG. 4 in combination, the third sub-pixel 10B may include a transparent structure 523 allowing a direct transmission of light incident thereon. For example, the transparent structure 523 of the third sub-pixel 10B may allow the direct transmission of the light with the third range of wavelength (for example, blue light) incident thereon. In some embodiments, the transparent structure 523 is provided with scattering particles 5231. Specifically, the scattering particles 5231 may be doped in a resin material, and then the resin material doped with the scattering particles 5231 may be used to fill the third sub-pixel opening 563. In this way, the scattering particles may enhance a light emission effect and increase a light emission viewing angle.

With reference to FIG. 2 to FIG. 4 in combination, the light source 12 may include a light emitting diode for emitting light with the third range of wavelength (for example, blue light), that is, a blue LED. For example, the light source 12 may emit blue light with a center wavelength of 450 nm and a half-peak width of 30-40 nm.

When the blue light emitted by the light source 12 is incident on the quantum dot structures 521, 522 and the transparent structure 523, the first quantum dot structure 521 may emit red light under the excitation of the blue light (that is, convert the blue light into red light), the second quantum dot structure 522 may emit green light under the excitation of the blue light (that is, convert the blue light into green light), and the blue light is directly transmitted through the transparent structure 523. In this way, the first sub-pixel 10R emits red light, the second sub-pixel 10G emits green light, and the third sub-pixel 10B emits blue light, so that the display panel according to the embodiments of the present disclosure may achieve the color display.

In the display panel and the display device provided by the embodiments of the present disclosure, the light conversion structure of the display panel includes the quantum dot structure, so that a display panel and a display device with high color gamut and large viewing angle may be achieved by using the advantages of quantum dots.

Optionally, in the embodiments of the present disclosure, the scattering particles may also be provided in the first quantum dot structure 521 and the second quantum dot structure 522 to improve a conversion efficiency of blue light, so as to improve a light efficiency of the display panel. For example, a plurality of scattering particles are provided in both the first quantum dot structure 521 and the second quantum dot structure 522. The scattering particles may scatter blue light, which effectively increases light paths of blue light in the quantum dot structure and the transparent structure, and increases a probability of incidence of blue light on each quantum dot, so that a light conversion rate of blue light into red light and green light may be increased. In this way, an overall light efficiency and viewing angle of the display panel may be improved.

Continuing to refer to FIG. 2, the first substrate 1 may further include an extinction layer 13 on the first base substrate 11, and the extinction layer 13 contains a light-absorbing material. The extinction layer 13 is located on a side of the plurality of light sources 12 facing the second substrate 5, and an orthographic projection of the extinction layer 13 on the first base substrate 11 surrounds the orthographic projection of the plurality of light sources 12 on the first base substrate 11. That is, the orthographic projection of the extinction layer 13 on the first base substrate 11 does not overlap with the orthographic projection of the plurality of light sources 12 on the first base substrate 11, but surrounds the orthographic projection of the plurality of light sources 12 on the first base substrate 11.

Figure 5:
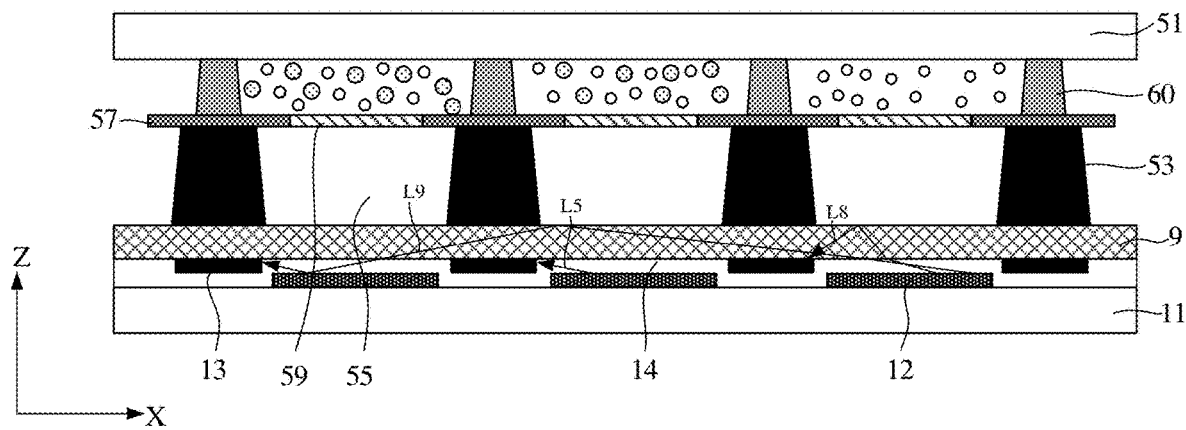
FIG. 5 shows a schematic cross-sectional view of a display panel taken along line AA' in FIG. 1 according to some embodiments of the present disclosure, in which a light path diagram of light rays with various exit angles emitted from a light source is schematically shown.

FIG. 5 shows a schematic cross-sectional views of a display panel taken along line AA' in FIG. 1 according to some embodiments of the present disclosure, in which a light path diagram of light rays with various exit angles emitted from a light source is schematically shown. As shown in FIG. 5, the extinction layer 13 may absorb a part of light ray L5 emitted from the light source 12 and with a light exit angle greater than a first specified angle. The first specified angle is related to factors such as a distance between the extinction layer 13 and the light source 12, a thickness of the extinction layer 13, and the like. For example, the first specified angle may be about 75°.

Referring to FIG. 2 to FIG. 5, the first substrate 1 may further include a light source protection layer 14 on the first base substrate 11, and the light source protection layer 14 is located on a side of the light source 12 facing the second substrate 5. An orthographic projection of the light source protection layer 14 on the first base substrate 11 covers the orthographic projection of the light sources 12 on the first base substrate 11.

The second substrate 5 may further include a plurality of light blocking structures 57 on the second base substrate 51, and the plurality of light blocking structures 57 between a layer where the extinction structure 53 is located and a layer where the light conversion structure 52 is located. For example, the light blocking structure 57 contains a light blocking material.

A second channel 58 is formed between any two adjacent light blocking structures 57. An orthographic projection of the second channel 58 on the second base substrate 51 falls within an orthographic projection of the first channel 54 on the second base substrate 51. A plurality of first channels 54 and a plurality of second channels 58 are respectively connected to form a plurality of light inlet channels.

The second substrate 5 may further include a plurality of quantum dot protection structures 59 on the second base substrate 51. The plurality of quantum dot protection structures 59 are located between the optical conversion structure 52 and the first optical structure 55, and orthographic projections of the plurality of quantum dot protection structures 59 on the second base substrate 51 are respectively located within the orthographic projections of the plurality of second channels 58 on the second base substrate 51. In this way, the plurality of quantum dot protection structures 59 may respectively protect the quantum dot structures located in each pixel opening. It should be noted that in the third sub-pixel 10B, the quantum dot protection structure 59 is also provided in the second channel 58 on a side of the transparent structure 523 facing the first substrate 1.

The second substrate 5 may further include a plurality of barrier wall structures 60 on the second base substrate 51. The plurality of barrier wall structures 60 are located between the second base substrate 51 and the plurality of extinction structures 53, and orthographic projections of the plurality of barrier wall structures 60 on the second base substrate 51 are respectively located within the orthographic projections of the plurality of extinction structures 53 on the second base substrate 51.

Referring to FIG. 2, the pixel openings 561, 562 and 563 mentioned above are located between any two adjacent barrier wall structures 60. Orthographic projections of the pixel openings 561, 562 and 563 on the first base substrate 11 respectively cover orthographic projections of the plurality of light inlet channels on the first base substrate 11, and respectively cover the orthographic projections of the plurality of light sources 12 on the first base substrate 11. In this way, the collimated light ray (which has an exit angle smaller than a design angle, for example, 60°) emitted from the light source 12 may be transmitted through the filler portion 9, enter the light inlet channel, and be incident on the quantum dot structure and the transparent structure located in each pixel opening.

It should be noted that, in the embodiments of the present disclosure, the light ray that may directly enter the light inlet channel through the filler portion 9 and be incident on the quantum dot structure and the transparent structure located in the each pixel opening is called the collimated light ray. A maximum value of an exit angle of the collimated light ray emitted from the light source 12 may be designed, and the maximum value of the exit angle may be referred to as a design angle. For example, the design angle may be about 60°.

In the embodiments of the present disclosure, the barrier wall structure 60, the light blocking structure 57, the extinction structure 53 and the extinction layer 13 each contain a light-absorbing material or a light-blocking material.

It should be noted that "light-absorbing material" herein means a material with high light (especially visible light) absorption rate, and the light-absorbing material may absorb most or all of the light incident thereon. The "light-blocking material" means a material with low light (especially visible light) transmittance rate, and the light-blocking material may absorb most or all of the light incident thereon, or may reflect most or all of the light incident thereon.

The barrier wall structure 60 may contain a light blocking material. For example, the barrier wall structure 60 may be a black barrier wall structure to absorb most or all of the light incident thereon. The barrier wall structure 60 may also be a gray barrier wall structure to reflect most or all of the light incident thereon.

The light blocking structure 57 may contain a light blocking material. For example, the light blocking structure 57 may be a light blocking structure with light absorption characteristics to absorb most or all of the light incident thereon. The light blocking structure 57 may also be a light blocking structure with light reflection characteristics to reflect most or all of the light incident thereon.

The extinction structure 53 may contain a light-absorbing material, such as a black light-absorbing material, to absorb most or all of the light incident thereon.

The extinction layer 13 may contain a light-absorbing material, such as a black light-absorbing material, to absorb most or all of the light incident thereon.

In the embodiments of the present disclosure, an orthographic projection of each light inlet channel on the first base substrate 11 has an area of 70%~90%, for example, 80%~90%, of an area of an orthographic projection of a pixel opening covering the each light inlet channel on the first base substrate 11. In this way, most of the collimated light ray may irradiate the quantum dot structure and the transparent structure located in the each pixel opening, and the light scattered by the scattering particles in the quantum dot structure and the transparent structure close to an edge portion of the pixel opening may be absorbed, so as to avoid cross-color of adjacent pixels.

For example, the orthographic projections of the plurality of barrier wall structures 60 on the second base substrate 51 are respectively located within the orthographic projections of the plurality of light blocking structures 57 on the second base substrate 51. The orthographic projections of the plurality of light blocking structures 57 on the second base substrate 51 are substantially coincident with the orthographic projections of the plurality of extinction structures 53 on the second base substrate 51 respectively. The orthographic projections of the plurality of extinction structures 53 on the first base substrate 11 are substantially coincident with the orthographic projection of the extinction layer 13 on the first base substrate 11.

For example, an orthographic projection of each extinction structure 53 on a first plane has a trapezoidal shape, and the first plane is perpendicular to a surface of the filler portion 9 away from the first substrate 1 and is parallel to the direction X. The extinction structure 53 has a first surface 531 facing the first base substrate 11 and a second surface 532 facing the second base substrate 51. The first surface 531 may have an area greater than that of the second surface 532.

In some exemplary embodiments, the filler portion 9 contains a material with a refractive index greater than that of the material of the first optical structure 55. That is, the first optical structure 55 is a low refractive index material portion, and the filler portion 9 is a high refractive index material portion. For example, a ratio of the refractive index of the material of the filler portion 9 to the refractive index of the material of the first optical structure 55 may be in a range of 1.1 to 1.5.

In some exemplary embodiments, the filler portion 9 contains a material with a refractive index greater than that of the material of the light source protection layer 14. That is, the light source protection layer 14 is a low refractive index material portion, and the filler portion 9 is a high refractive index material portion. For example, a ratio of the refractive index of the material of the filler portion 9 to the refractive index of the material of the light source protection layer 14 may be in a range of 1.1 to 1.5.

In some exemplary embodiments, the quantum dot protection structure 59 contains a material with a refractive index substantially equal to that of the material of the first optical structure 55. For example, a difference between the refractive indexes of the two may be within ±5% of the refractive index of the material of the first optical structure 55.

In some exemplary embodiments, a surface of the filler portion 9 facing the second base substrate 51 is in contact with a surface of the first optical structure 55 away from the second base substrate 51, and a surface of the filler portion 9 away from the second base substrate 51 is in contact with a surface of the light source protection layer 14 away from the first base substrate 11. That is, the filler portion 9 with a high refractive index is sandwiched between the light source protection layer 14 with a low refractive index and the first optical structure 55 with a low refractive index.

For ease of description, an interface between the light source protection layer 14 and the filler portion 9 is referred to as a first interface S1, and an interface between the filler portion 9 and the first optical structure 55 is referred to as a second interface S2.

With reference to FIG. 2 to FIG. 5, a part of light ray L6 in light rays with various angels emitted from the light source 12 has an exit angle slightly greater than 0°, for example, in a range of about 0°~10°. That is, this part of light rays does not exit completely in the vertical direction, but has a certain exit angle. When the light ray L6 is incident on the first interface S1, due to a combination of the low refractive index of the light source protection layer 14 and the high refractive index of the filler portion 9, the light ray L6 may substantially exit from the first interface S1 in the vertical direction, so as to improve an effect of exciting the quantum dot structure. In addition, through the matching of refractive index, a large angle of the exit light may be adjusted to an acceptable range, so that the light efficiency may be improved.

For example, a part of light ray L2 of the light rays with various angles emitted from the light source 12 may have a large exit angle, which may be, for example, in a range of about 70°~80°. When the light ray L2 is incident on the first interface S1, through the matching of refractive index, the light ray L2 may be incident on a bottom surface of the corresponding extinction structure 53 so as to be absorbed by the extinction structure 53. In this way, this part of the light rays may be prevented from entering adjacent pixels, thereby avoiding cross interference of pixels.

For example, a part of light ray L7 of the light rays with various angles emitted from the light source 12 may have a particularly large exit angle, which may be, for example, in a range of about 80°~89°. When the light ray L7 is incident on the first interface S1 and the second interface S2, through the matching of refractive index, the light ray L7 may be incident on a side wall of the corresponding extinction structure 53 so as to be absorbed by the extinction structure 53. In this way, this part of the light rays may be prevented from entering adjacent pixels, thereby avoiding cross interference of pixels.

For example, a part of light ray L8 of the light rays with various angles emitted from the light source 12 may have a particularly large exit angle, which may be, for example, in a range of about 80°~89°. When the light ray L8 is incident on the second interface S2, through the matching of refractive index, the light ray L8 may be totally reflected at the second interface S2, that is, the light L8 may be reflected back and then be absorbed by the extinction layer 13 located below.

For example, for a part of light ray L9 of the light rays with various angles emitted from the light source 12, when incident on the second interface S2, the light ray L9 may be totally reflected at the second interface S2 through the matching of refractive index. That is, the light L9 may be reflected back and the reflected light ray L9 may be further reflected on the light source 12 to the extinction layer 13, and is then absorbed by the extinction layer 13.

For example, a part of light ray L10 of the light rays with various angles emitted from the light source 12, when incident on the second interface S2, the light ray L10 may be totally reflected at the second interface S2 through the matching of refractive index. That is, the light ray L10 may be reflected back and the reflected light ray L10 may be further reflected on the light source 12 to the surface of the extinction structure 53, so as to be absorbed by the extinction structure 53.

For example, a part of light ray L11 of the light rays with various angles emitted from the light source 12, when incident on the second interface S2, the light ray L11 may be totally reflected at the second interface S2 through the combination of refractive index. That is, the light ray L11 may be reflected back and the reflected light ray 11 may be further reflected on the light source 12 to the side wall of the extinction structure 53, so as to be absorbed by the extinction structure 53.

In the embodiments of the present disclosure, by providing the high refractive index material portion and the low refractive index material portion, the non-collimated light ray (that is, the light ray emitted at an angle greater than the design angle) may be incident on the extinction layer or the extinction structure, which is beneficial to absorption of the non-collimated light ray, so that cross-color phenomenon of pixels may be avoided.

As shown in FIG. 5, the extinction layer 13 is located higher than the light source 12, that is, the surface of the extinction layer 13 facing the second substrate 5 is closer to the second substrate 5 than the surface of the light source 12 facing the second substrate 5, so that the extinction layer 13 may absorb at least a part of the light ray L5 emitted from the light source 12 and having an exit angle greater than the first specified angle.

Figure 7:
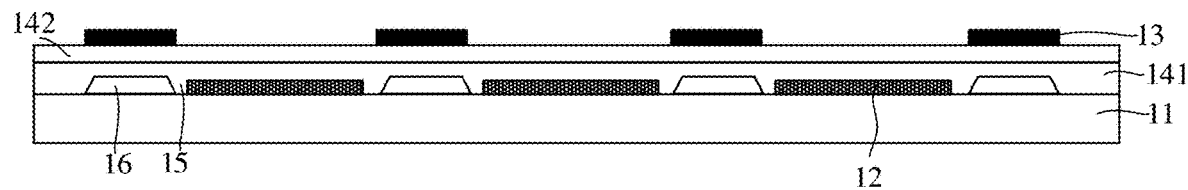
FIG. 7 shows a partial enlarged view of part II in FIG. 2.

FIG. 7 shows a partial enlarged view of part II in FIG. 2. With reference to FIG. 2 and FIG. 7 in combination, in some exemplary embodiments, the light source protection layer 14 may include a first protection layer 141 and a second protection layer 142. The first protection layer 141 may be an inorganic protection layer, and the second protection layer 142 may be a cover layer.

The first substrate 1 may include a first planarization layer 16, and the first planarization layer 16 may include a plurality of openings 15. The plurality of light sources 12 are respectively arranged in the plurality of openings 15. The first protection layer 141 may be arranged on a side of the first planarization layer 16 away from the first base substrate 11, and may cover the first planarization layer 16 and the plurality of light sources 12. The second protection layer 142 may be arranged on a side of the first protection layer 141 away from the first base substrate 11. The extinction layer 13 may be arranged on a side of the second protection layer 142 away from the first base substrate 11.

Figure 6:
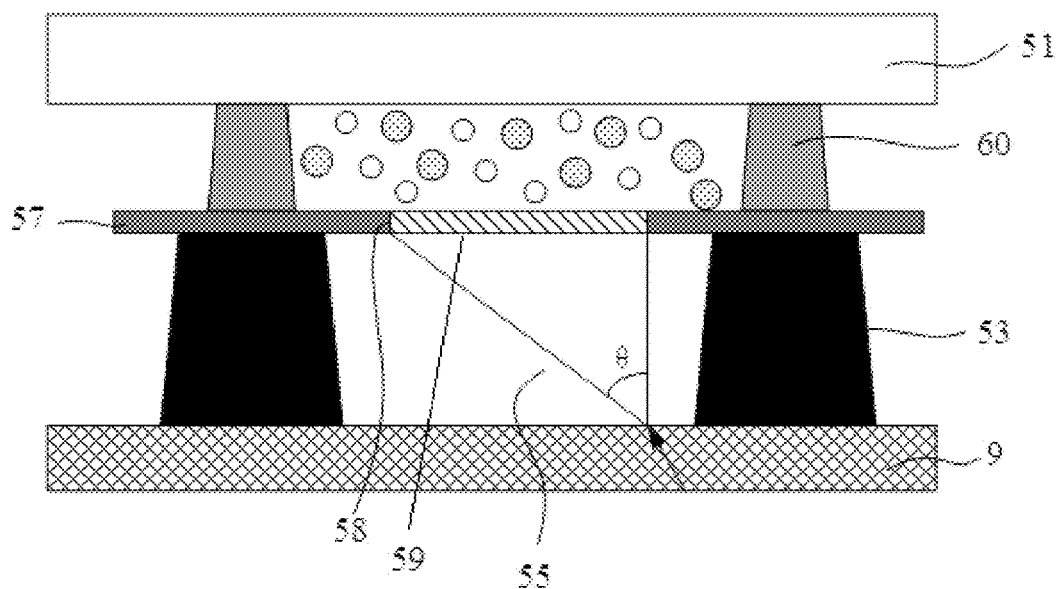
FIG. 6 shows a partial enlarged view of part I in FIG. 2.

FIG. 6 is a partial enlarged view of part I in FIG. 2. With reference to FIG. 2 and FIG. 6 in combination, in the embodiments of the present disclosure, a thickness of the extinction structure 53 may be designed. For example, the thickness of the extinction structure 53 may be designed such that a part of the light ray refracted at the interface between the filler portion 9 and the first optical structure 55 (that is, the second interface S2) is absorbed by the extinction structure 53, and the part of the light ray has an exit angle greater than a second specified angle. For example, the second specified angle may be substantially equal to the design angle, for example, about 60°.

For example, in a specific embodiment, the pixel opening may have a width of about 50 microns. Accordingly, the second channel 58 may have a width of about 30 microns. In the design, it is required that in the light rays with various angles exit from the second interface S2, a light ray with an exit angle (an angle θ in FIG. 6) less than or equal to 60° may pass through the second channel 58, and a light ray with an exit angle greater than 60° is absorbed by the extinction structure 53. In this case, the thickness of the extinction structure 53 is equal to 30 μm*cos 60°, which is equal to about 15 μm.

Therefore, in the embodiments of the present disclosure, taking into account the actual size of each pixel opening, the thickness of the extinction structure 53 may be set between 8 microns and 15 microns, so that the light ray with the exit angle less than or equal to the design angle may be incident on the quantum dot structure, and the light ray with the exit angle greater than the design angle is absorbed by the extinction structure, so as to meet the design requirements.

In the embodiments of the present disclosure, a thickness of the filler portion 9 may be set between 3 microns and 8 microns, so that the filler portion 9 may fill the gap between the first substrate 1 and the second substrate 5, and may also function to adjust the exit angle of the light ray emitted from the light source 12.

A thickness of the light blocking structure 57 may be set between 0.5 microns and 2 microns. A thickness of the extinction layer 13 may be set between 2 microns and 3 microns. A thickness of the light source protection layer 14 is between 500 nanometers and 1000 nanometers. A thickness of the quantum dot protection structure 59 is between 500 nanometers and 1000 nanometers. A thickness of the barrier wall structure 60 is between 6 microns and 15 microns.

Figure 8:
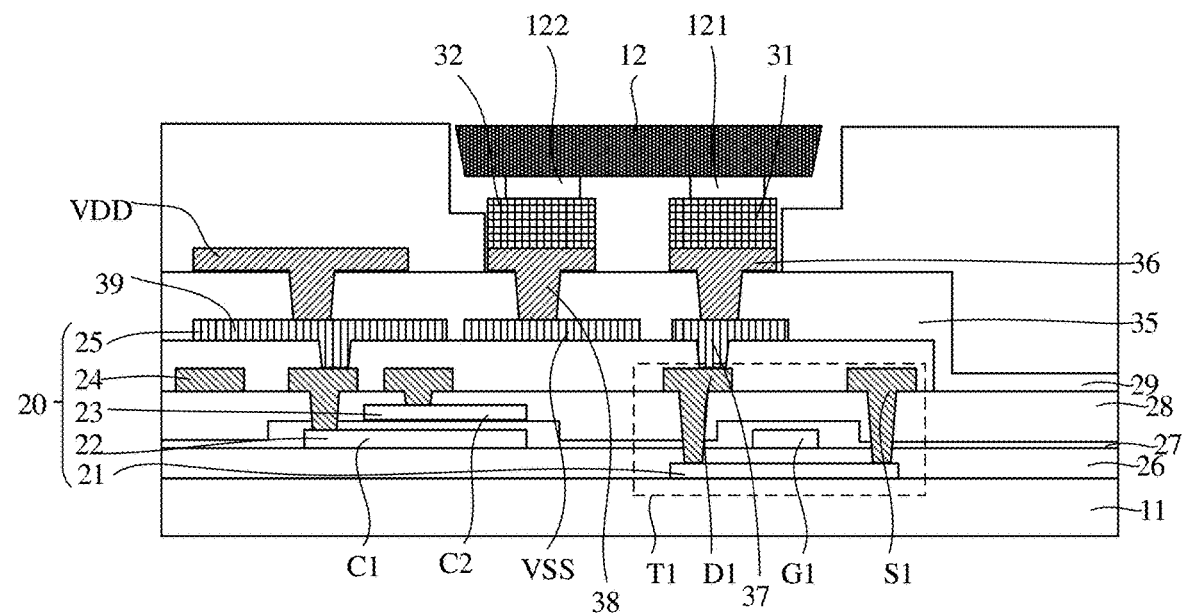
FIG. 8 shows a partial cross-sectional view of a first substrate of a display panel according to some exemplary embodiments of the present disclosure, in which a light source of the display panel includes an inorganic light emitting diode.

In the embodiments of the present disclosure, the plurality of light sources 12 may include a plurality of micro light emitting diodes or a plurality of mini light emitting diodes. FIG. 8 shows a partial cross-sectional view of a first substrate of a display panel according to some exemplary embodiments of the present disclosure, in which a light source of the display panel includes an inorganic light emitting diode. For example, the inorganic light emitting diode may be a micro light emitting diode or a plurality of mini light emitting diodes.

With reference to FIG. 2 and FIG. 8 in combination, the first substrate 1 may further include a pixel driving circuit layer 20 on the first base substrate 11. The pixel driving circuit layer 20 includes a plurality of thin film transistors that includes at least a driving transistor T1. The first substrate 1 may further include a plurality of pad groups on a side of the pixel driving circuit layer 20 facing the second substrate 5, and each of the pad groups includes a first pad 31 and a second pad 32. The first pad 31 is electrically connected to a source electrode or a drain electrode of the driving transistor T1, and the second pad 32 is electrically connected to a power supply negative electrode VSS of the display panel. The plurality of light sources 12 are located on a side of the pad group facing the second substrate 5. Each light source 12 includes a first pin 121 electrically connected to the first pad 31 and a second pin 122 electrically connected to the second pad 32.

In some exemplary embodiments, as shown in FIG. 8, the pixel driving circuit layer 20 may include an active layer 21, a first conductive layer 22, a second conductive layer 23, a third conductive layer 24, and a fourth conductive layer 25.

Each thin film transistor may have a gate electrode in the first conductive layer 22. For example, a gate electrode G1 of the driving transistor T1 and a first plate C1 of a storage capacitor may be located in the first conductive layer 22.

A second plate C2 of the storage capacitor may be located in the second conductive layer 23. The first plate C1 and the second plate C2 are arranged opposite and spaced apart. A dielectric layer is arranged between the first plate C1 and the second plate C2 to form a storage capacitor.

Each thin film transistor may have a source electrode and a drain electrode in the third conductive layer 24. For example, a source electrode S1 and a drain electrode D1 of the driving transistor may be located in the third conductive layer 24. A data line 231 may be located in the third conductive layer 23.

A power supply positive electrode VDD and the power supply negative electrode VSS of the display panel may be located in the fourth conductive layer 25.

The first substrate 1 may further include insulating film layers between any adjacent two of the active layer 21, the first conductive layer 22, the second conductive layer 23, the third conductive layer 24 and the fourth conductive layer 25. For example, the insulating film layers may include a first gate insulating layer 26 between the active layer 21 and the first conductive layer 22, a second gate insulating layer 27 between the first conductive layer 22 and the second conductive layer 23, an interlayer dielectric layer 28 between the second conductive layer 23 and the third conductive layer 24, and a second planarization layer 29 between the third conductive layer 24 and the fourth conductive layer 25. In addition, the first substrate 1 may further include a third planarization layer 35 on a side of the fourth conductive layer 25 away from the first base substrate 11.

The first pad 31 is electrically connected to the drain electrode D1 of the driving transistor T1 through a first connecting portion 36 and a second connecting portion 37, and the second pad 32 is electrically connected to the power supply negative electrode VSS through a third connecting portion 38.

The first plate C1 is electrically connected to the power supply positive electrode VDD through a fourth connecting portion 39.

It should be noted that the first pad 31 and the second pad 32 may contain a conductive material such as indium tin oxide, metallic copper, nickel-gold alloy and the like.

Under the control of the pixel driving circuit of each sub-pixel, it is possible to selectively control the inorganic light emitting diode of each sub-pixel to emit light, so as to display a desired image or picture.

Figure 9:
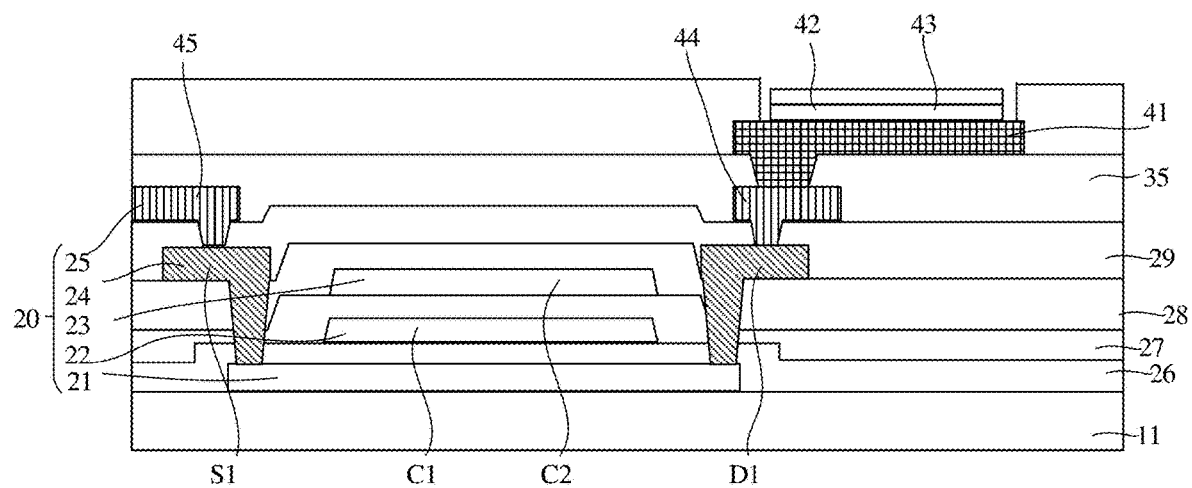
FIG. 9 shows a partial cross-sectional view of a first substrate of a display panel according to some exemplary embodiments of the present disclosure, in which a light source of the display panel includes an organic light emitting diode.

In the embodiments of the present disclosure, the plurality of light sources 12 may include a plurality of organic light emitting diodes. FIG. 9 shows a partial cross-sectional view of a first substrate of a display panel according to some exemplary embodiments of the present disclosure, in which a light source of the display panel includes an organic light emitting diode.

With reference to FIG. 2 and FIG. 9 in combination, the first substrate 1 may further include: a pixel driving circuit layer 20 on the first base substrate 11, the pixel driving circuit layer 20 includes a plurality of thin film transistors; and a plurality of organic light emitting diodes 40 on a side of the pixel driving circuit layer 20 facing the second substrate 5. Each organic light emitting diode 40 includes an anode electrode 41 on a side of the pixel driving circuit layer 20 facing the second substrate 5, an organic light emitting layer 42 on a side of the anode electrode 41 facing the second substrate 5, and a cathode electrode 43 on a side of the organic light emitting layer 42 facing the second substrate 5.

In some exemplary embodiments, as shown in FIG. 9, the pixel driving circuit layer 20 may include an active layer 21, a first conductive layer 22, a second conductive layer 23, a third conductive layer 24, and a fourth conductive layer 25.

Each thin film transistor may have a gate electrode in the first conductive layer 22. For example, a gate electrode of the driving transistor and a first plate C1 of a storage capacitor may be located in the first conductive layer 22.

A second plate C2 of the storage capacitor may be located in the second conductive layer 23. The first plate C1 and the second plate C2 are arranged opposite and spaced apart. A dielectric layer is arranged between the first plate C1 and the second plate C2 to form a storage capacitor.

Each thin film transistor may have a source electrode and a drain electrode located in the third conductive layer 24. For example, a source electrode S1 and a drain electrode D1 of the driving transistor may be located in the third conductive layer 24.

The first connecting portion 44 and the second connecting portion 45 may be located in the fourth conductive layer 25.

The first substrate 1 may further include insulating film layers arranged between any adjacent two of the active layer 21, the first conductive layer 22, the second conductive layer 23, the third conductive layer 24 and the fourth conductive layer 25. For example, the insulating film layers may include: a first gate insulating layer 26 between the active layer 21 and the first conductive layer 22, a second gate insulating layer 26 between the first conductive layer 22 and the second conductive layer 23, an interlayer dielectric layer 28 between the second conductive layer 23 and the third conductive layer 24, and a second planarization layer 29 between the third conductive layer 24 and the fourth conductive layer 25. In addition, the first substrate 1 may further include a third planarization layer 35 on a side of the fourth conductive layer 25 away from the first base substrate 11.

The anode electrode 41 may be electrically connected to the drain electrode of a transistor through a first connecting portion 44.

Figure 10:
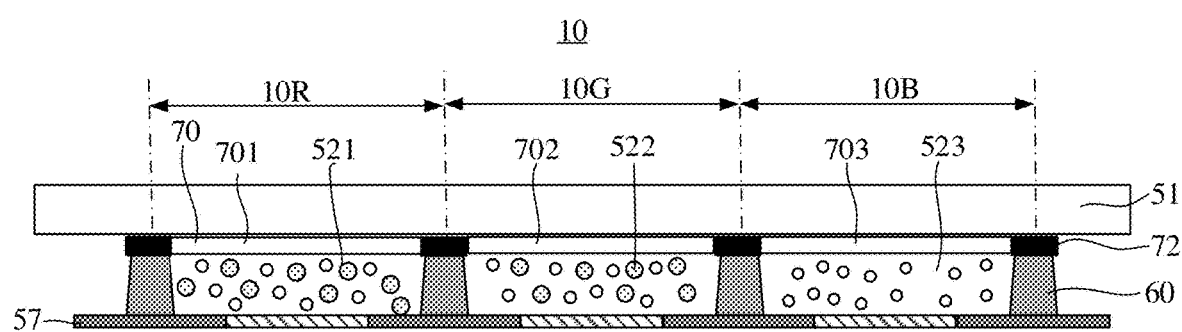
FIG. 10 shows a partial enlarged view of part III in FIG. 2.

FIG. 10 shows a partial enlarged view of part III in FIG. 2. With reference to FIG. 2 and FIG. 10 in combination, the second substrate 5 may further include a filter layer 70 between the second base substrate 51 and the layer where the quantum dot structure and the transparent structure are located. The filter layer 70 may include a plurality of filter structures for allowing transmission of light of different colors. For example, the plurality of filter structures may be arranged in one-to-one correspondence with the plurality of sub-pixels. As shown in FIG. 10, the filter layer 70 may include a first filter structure 701, a second filter structure 702 and a third filter structure 703. It should be understood that the first sub-pixel 10R includes a first filter structure 701, the second sub-pixel 10G includes a second filter structure 702, and the third sub-pixel 10B includes a third filter structure 703. The first filter structure 701 is used to allow transmission of the light of the first color, the second filter structure 702 is used to allow transmission of the light of the second color, and the third filter structure 703 is used to allow transmission of the light of the third color.

Specifically, the first filter structure 701 is arranged corresponding to the first quantum dot structure 521. That is, the first sub-pixel 10R includes the first filter structure 701 and the first quantum dot structure 521, and an orthographic projection of the first quantum dot structure 521 on the second base substrate 51 falls within an orthographic projection of the first filter structure 701 on the second base substrate 51. The second filter structure 702 is arranged corresponding to the second quantum dot structure 522. That is, the second sub-pixel 10G includes the second filter structure 702 and the second quantum dot structure 522, and an orthographic projection of the second quantum dot structure 522 on the second base substrate 51 falls within an orthographic projection of the second filter structure 702 on the second base substrate 51. For example, the orthographic projection of the second quantum dot structure 522 on the second base substrate 51 has an area less than that of the orthographic projection of the second filter structure 702 on the second base substrate 51. The third filter structure 703 is arranged corresponding to the transparent structure 523. That is, the third sub-pixel 10B includes the third filter structure 703 and the transparent structure 523, and an orthographic projection of the transparent structure 523 on the second base substrate 51 falls within an orthographic projection of the third filter structure 703 on the second base substrate 51.

The filter layer 70 may be arranged between the second base substrate 51 and the layer where the quantum dot structure and the transparent structure are located. That is, the filter layer 70 may be arranged on a light exit side of the quantum dot structure and the transparent structure. As mentioned above, the first quantum dot structure 521 and the second quantum dot structure 523 may convert blue light into red light and green light, respectively. In addition, a part of blue light is not converted by the first quantum dot structure 521 and the second quantum dot structure 523. By providing the filter layer 70, this part of blue light may be absorbed, which avoids mixing the blue light with the red light emitted from the first sub-pixel and the green light emitted from the second sub-pixel, so that a color gamut of the display panel may be further improved. Furthermore, the filter layer 70 may further absorb external light so as to avoid poor display caused by external light exciting the quantum dot structure.

Optionally, referring to FIG. 10, the display panel 10 may further include a black matrix 72. It should be understood that the black matrix 72 may function to separate pixels, prevent light leakage and cross-color.

It should be understood that the black matrix 72 may be set with reference to a black matrix in a conventional display panel, which will not be repeated here.

Figure 11:
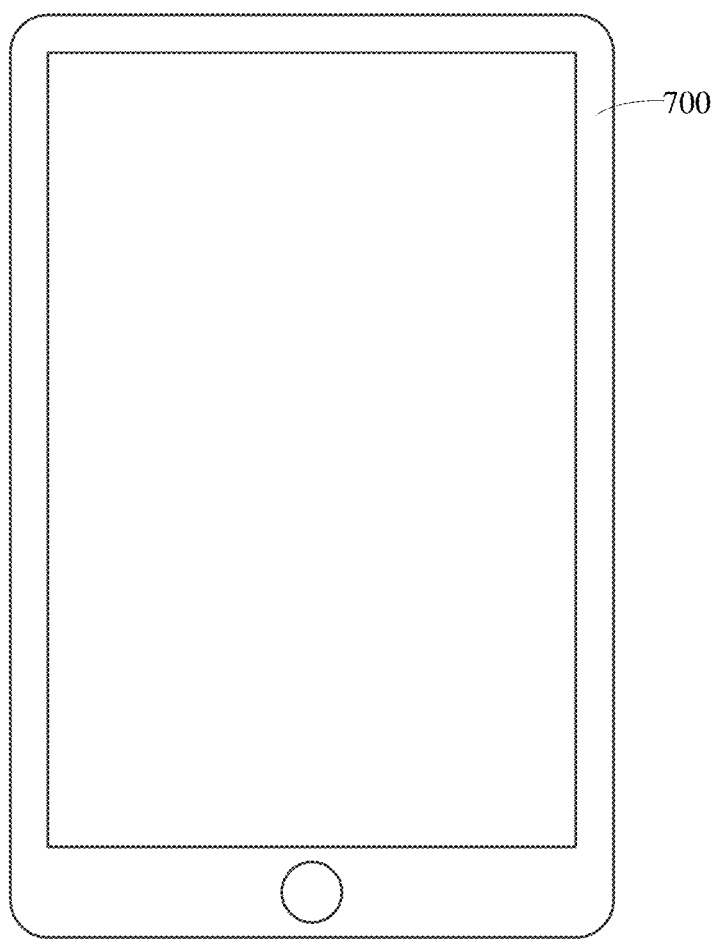
FIG. 11 shows a plan view of a display device according to some embodiments of the present disclosure.

The embodiments of the present disclosure further provide a display device, including the display panel provided in the embodiments described above. FIG. 11 shows a plan view of a display device 700 according to some embodiments of the present disclosure. The display device 700 may include the display panel according to any one of the embodiments described above. For example, the display device may be a smart phone, a wearable smart watch, smart glasses, a tablet computer, a television, a display, a laptop computer, a digital photo frame, a navigator, a vehicle display, an e-book, or any other product or component with a display function.

Figure 12:
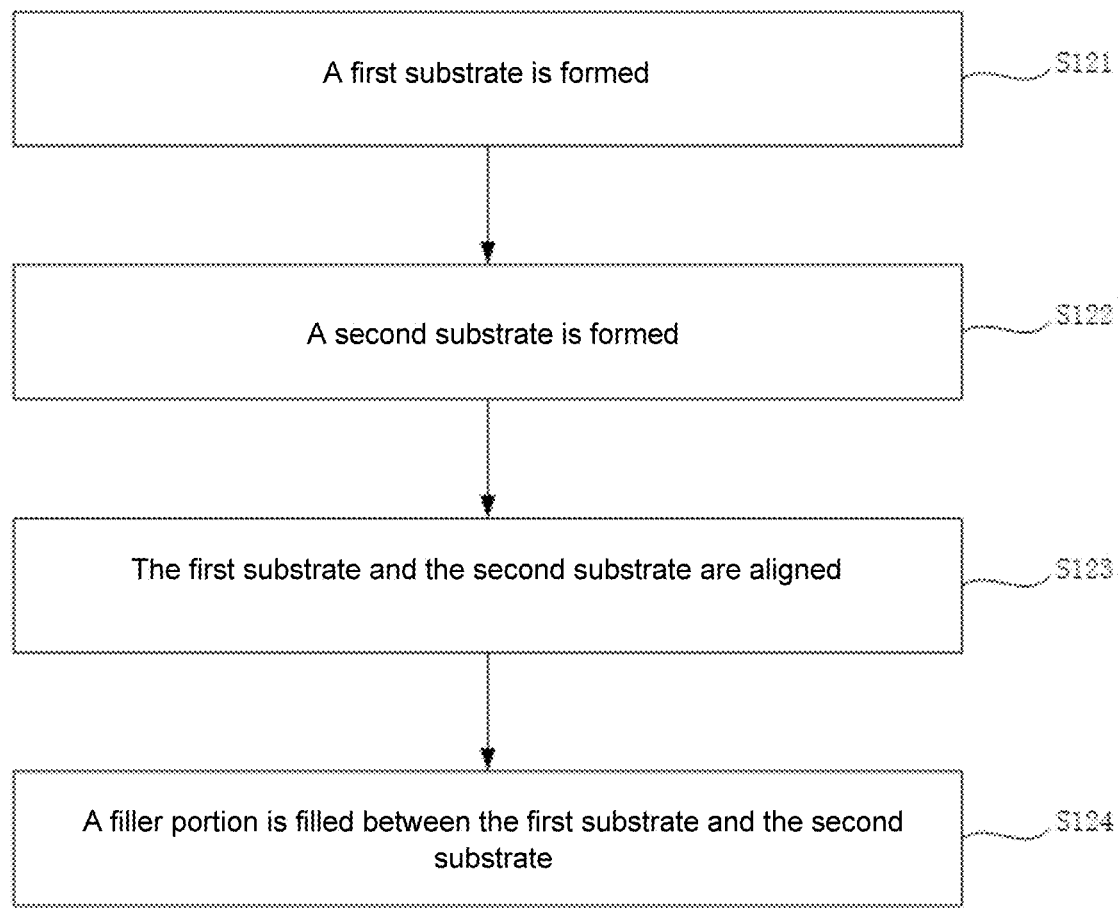
FIG. 12 shows a flowchart of a method of manufacturing a display panel according to some embodiments of the present disclosure.
Figure 13A:
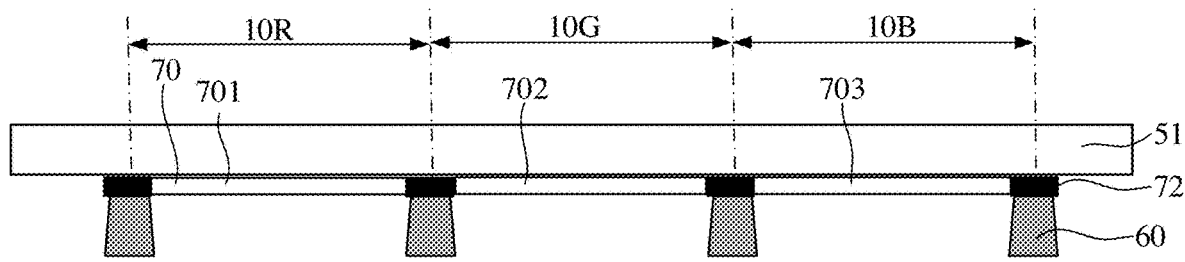
FIG. 13A to FIG. 13E respectively show cross-sectional views of structures formed after some steps in the method shown in FIG. 12 are performed.
Figure 13B:
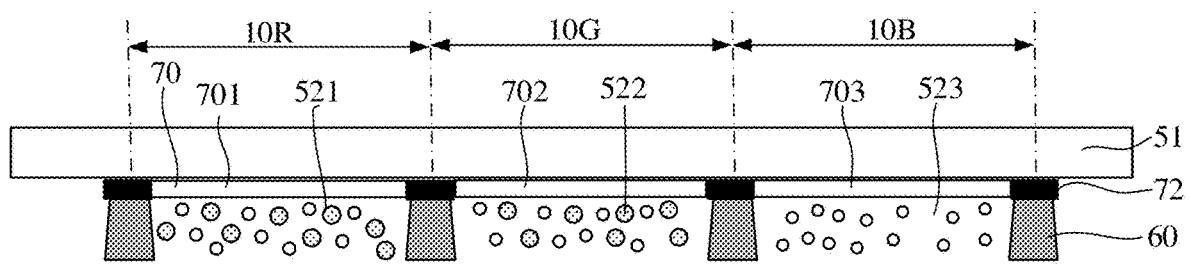
Figure 13C:
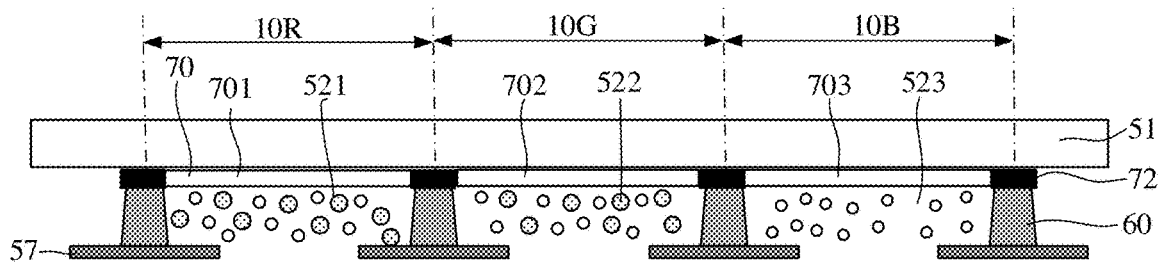
Figure 13D:
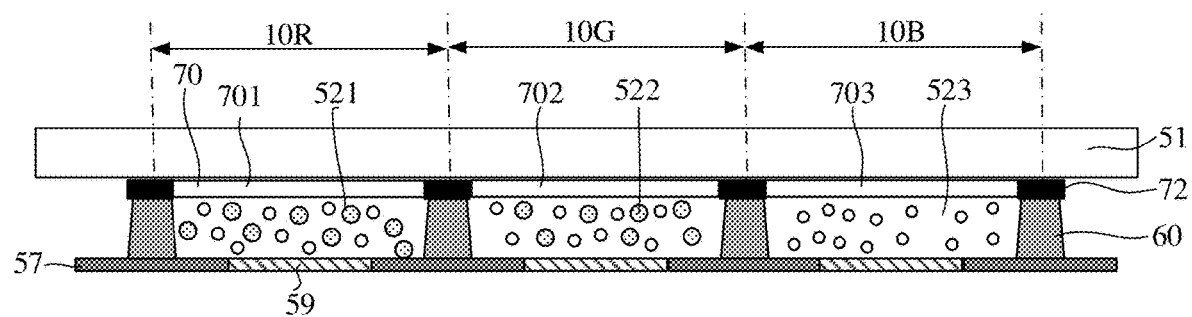
Figure 13E:
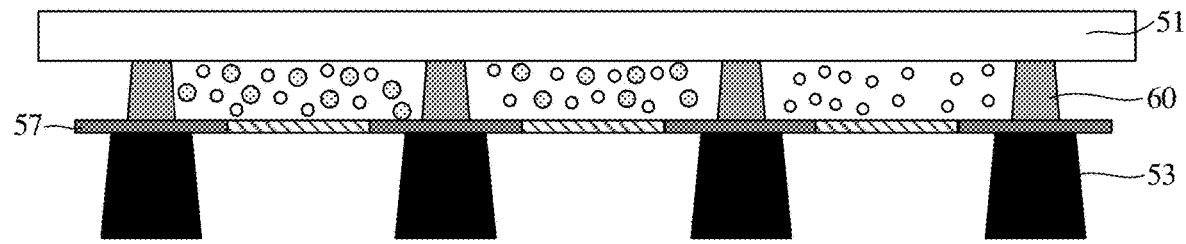

FIG. 12 shows a flowchart of a method of manufacturing a display panel according to some embodiments of the present disclosure. FIG. 13A to FIG. 13E respectively show cross-sectional views of structures formed after some steps in the method shown in FIG. 12 are performed. Referring to FIG. 2, FIG. 12 and FIG. 13A to FIG. 13E in combination, the method may include at least following steps.

In step S121, a first substrate 1 is formed.

For example, the forming of the first substrate 1 may include forming a plurality of light sources 12 on a first base substrate 11.

With reference to FIG. 8 and FIG. 9 in combination, the forming of the first substrate 1 may include forming a pixel driving circuit layer 20 on the first base substrate 11, and then forming the plurality of light sources 12 on a side of the pixel driving circuit layer 20 away from the first base substrate 11, so that the plurality of light sources 12 are electrically connected to respective pixel driving circuits.

The forming of the first substrate 1 may further include: forming a light source protection layer 14 on a side of the layer where the light source 12 is located away from the first base substrate 11; and forming an extinction layer 13 on a side of the light source protection layer 14 away from the first base substrate 11. For example, the light source protection layer 14 may be formed by a chemical deposition process, and the extinction layer 13 may be formed by a patterning process.

In step S122, a second substrate 5 is formed.

The forming of the second substrate 5 may include: forming a light conversion structure 52 on a second base substrate 51, the light conversion structure 52 including at least a plurality of quantum dot structures; forming a plurality of extinction structures 53 on a side of the light conversion structure 52 away from the second base substrate 51 by a patterning process, wherein a first channel 54 is formed between any two adjacent extinction structures 53; and forming a plurality of first optical structures 55 on a side of the light conversion structure 52 away from the second base substrate 51 and in the plurality of first channels 54 by a printing process.

In step S122, a barrier wall structure 60 may be formed by a patterning process, and the barrier wall structure 60 surrounds to form a plurality of pixel openings. In the plurality of pixel openings, a plurality of quantum dot structures are formed by a printing process, so as to form the light conversion structure 52. For example, a quantum dot protection structure 59 is formed on a side of the light conversion structure 52 away from the second base substrate 51 by a chemical deposition process. Then, a light blocking structure 57 is formed on a side of the barrier wall structure 60 away from the second base substrate 51 by a patterning process. An extinction structure 53 is formed on a side of the light blocking structure 57 away from the second base substrate 51 by a patterning process. A first channel 54 is formed between any two adjacent extinction structures 53. A plurality of first optical structures 55 are formed on a side of the quantum dot protection structure 59 away from the second base substrate 51 and in the plurality of first channels 54 by a printing process.

In step S123, the first substrate 1 and the second substrate 5 are aligned.

In step S124, a filler portion 9 is formed between the first substrate 1 and the second substrate 5.

It should be noted that according to some embodiments of the present disclosure, some steps in the above method may be performed separately or in combination, and may be performed in parallel or sequentially, and are not limited to the specific operation sequence shown in FIG. 12.

Although some embodiments according to the general inventive concept of the present disclosure have been illustrated and described, it should be understood by those ordinary skilled in the art that these embodiments may be changed without departing from the principle and spirit of the general inventive concept of the present disclosure. The scope of the present disclosure is defined by the claims and their equivalents.

What is claimed is:

1. A display panel, comprising:
   a first base substrate;
   a plurality of light sources on the first base substrate;
   a second base substrate opposite to the first base substrate;
   a light conversion structure on the second base substrate, wherein the light conversion structure comprises at least a plurality of quantum dot structures;
   a plurality of extinction structures on a side of the light conversion structure facing the first base substrate, wherein a first channel is formed between any two adjacent extinction structures;
   a plurality of first optical structures on the side of the light conversion structure facing the first base substrate, wherein each of the plurality of first optical structures is located in the first channel between two adjacent extinction structures; and
   a filler portion between the first base substrate and the second base substrate, wherein the filler portion is located between the plurality of light sources and the plurality of first optical structures,
   wherein the filler portion contains a material with a refractive index greater than that of a material of the first optical structure, and the extinction structure contains a light-absorbing material; and
   wherein orthographic projections of the plurality of light sources on the first base substrate at least partially overlap orthographic projections of the plurality of first optical structures on the first base substrate, an orthographic projection of the light conversion structure on the first base substrate at least partially overlaps the orthographic projections of the plurality of first optical structures on the first base substrate, and the orthographic projections of the plurality of first optical structures on the first base substrate fall within an orthographic projection of the filler portion on the first base substrate.

2. The display panel of claim 1, further comprising an extinction layer on the first base substrate, wherein the extinction layer contains a light-absorbing material, the extinction layer is located on a side of the plurality of light sources facing the second base substrate, and an orthographic projection of each light source on the first base substrate is surrounded by the orthographic projection of the extinction layer on the first base substrate.

3. The display panel of claim 2, further comprising a light source protection layer on the first base substrate, wherein the light source protection layer is located on a side of the light source facing the second base substrate, and an orthographic projection of the light source protection layer on the first base substrate covers the orthographic projection of the light source on the first base substrate; and wherein the light source protection layer contains a material with a refractive index smaller than that of the material of the filler portion.

4. The display panel of claim 3, wherein:
   a surface of the filler portion facing the second base substrate is in contact with a surface of the first optical structure away from the second base substrate; and/or
   a surface of the filler portion away from the second base substrate is in contact with a surface of the light source protection layer away from the first base substrate.

5. The display panel of claim 4, wherein a thickness of the extinction structure is designed such that a part of a light ray refracted at an interface between the filler portion and the first optical structure is absorbed by the extinction structure, wherein the part of the light ray has an exit angle greater than a second specified angle, and
   wherein the extinction structure has a thickness between 8 microns and 15 microns.

6. The display panel of claim 2, wherein a surface of the extinction layer facing the second base substrate is closer to the second base substrate than a surface of the light source facing the second base substrate, so as to allow the extinction layer to absorb at least a part of a light ray emitted from the light source and having an exit angle greater than a first specified angle.

7. The display panel of claim 1, further comprising a plurality of light blocking structures on the second base substrate, wherein the plurality of light blocking structures are located between a layer where the extinction structure is located and a layer where the light conversion structure is located; and
   wherein the light blocking structure contains a light blocking material, a second channel is formed between any two adjacent light blocking structures, an orthographic projection of the second channel on the second base substrate falls within an orthographic projection of the first channel on the second base substrate, and a plurality of first channels and a plurality of second channels are respectively connected to form a plurality of light inlet channels.

8. The display panel of claim 7, further comprising a plurality of quantum dot protection structures on the second base substrate, wherein the plurality of quantum dot protection structures are located between the light conversion structure and the first optical structure, and orthographic projections of the plurality of quantum dot protection structures on the second base substrate are respectively located within orthographic projections of the plurality of second channels on the second base substrate.

9. The display panel of claim 8, further comprising a plurality of barrier wall structures on the second base substrate, wherein the plurality of barrier wall structures are located between the second base substrate and the plurality of extinction structures, and orthographic projections of the plurality of barrier wall structures on the second base substrate are respectively located within orthographic projections of the plurality of extinction structures on the second base substrate.

10. The display panel of claim 9, wherein a pixel opening is formed between any two adjacent barrier wall structures, orthographic projections of a plurality of pixel openings on the first base substrate respectively cover orthographic projections of the plurality of light inlet channels on the first base substrate, and orthographic projections of the plurality of pixel openings on the first base substrate respectively cover orthographic projections of the plurality of light sources on the first base substrate.

11. The display panel of claim 10, wherein the pixel opening comprises a first sub-pixel opening and a second sub-pixel opening, the plurality of quantum dot structures comprise a first quantum dot structure configured to convert light with a third range of wavelength incident thereon into light with a first range of wavelength, and a second quantum dot structure configured to convert light with the third range of wavelength incident thereon into light with a second range of wavelength, and the first range of wavelength, the second range of wavelength and the third range of wavelength are different from each other;
  wherein the first quantum dot structure is located in the first sub-pixel opening, and the second quantum dot structure is located in the second sub-pixel opening; and
  wherein the pixel opening further comprises a third sub-pixel opening, and the display panel further comprises scattering particles provided in the third sub-pixel opening.

12. The display panel of claim 9, wherein:
  the filler portion has a thickness between 3 microns and 8 microns; and/or
  the light blocking structure has a thickness between 0.5 microns and 2 microns; and/or
  the extinction layer has a thickness between 2 microns and 3 microns; and/or
  the light source protection layer has a thickness between 500 nanometers and 1000 nanometers; and/or
  the quantum dot protection structure has a thickness between 500 nanometers and 1000 nanometers; and/or
  the barrier wall structure has a thickness between 6 microns and 15 microns.

13. The display panel of claim 8, wherein:
  a ratio of the refractive index of the material of the filler portion to the refractive index of the material of the first optical structure is in a range of 1.1 to 1.5; and/or
  a ratio of the refractive index of the material of the filler portion to the refractive index of the material of the light source protection layer is in a range of 1.1 to 1.5; and/or
  the quantum dot protection structure contains a material with a refractive index substantially equal to that of the material of the first optical structure.

14. The display panel of claim 8, wherein an orthographic projection of each light inlet channel on the first base substrate has an area of 80%-90% of an area of an orthographic projection of a pixel opening covering each light inlet channel on the first base substrate.

15. The display panel of claim 1, wherein the plurality of light sources comprise a plurality of micro light emitting diodes or a plurality of mini light emitting diodes.

16. The display panel of claim 15, further comprising:
  a pixel driving circuit layer on the first base substrate, wherein the pixel driving circuit layer comprises a plurality of thin film transistors including at least a driving transistor; and
  a plurality of pad groups on a side of the pixel driving circuit layer facing the second base substrate, wherein each of the pad groups comprises a first pad and a second pad,
  wherein the first pad is electrically connected to a source electrode or a drain electrode of the driving transistor, and the second pad is electrically connected to a power supply negative electrode of the display panel; and
  wherein the plurality of light sources are located on a side of the pad group facing the second base substrate, and each light source comprises a first pin electrically connected to the first pad and a second pin electrically connected to the second pad.

17. The display panel of claim 1, wherein the plurality of light sources comprise a plurality of organic light emitting diodes.

18. The display panel of claim 17, further comprising:
  a pixel driving circuit layer on the first base substrate, wherein the pixel driving circuit layer comprises a plurality of thin film transistors comprising at least a driving transistor;
  wherein the plurality of organic light emitting diodes are on a side of the pixel driving circuit layer facing the second base substrate, wherein each organic light emitting diode comprises an anode electrode on a side of the pixel driving circuit layer facing the second base substrate, an organic light emitting layer on a side of the anode electrode facing the second base substrate, and a cathode electrode on a side of the organic light emitting layer facing the second base substrate.

19. A display device, comprising the display substrate of claim 1.

20. A method of manufacturing a display panel, comprising:
  forming a first substrate, comprising forming a plurality of light sources on a first base substrate;
  forming a second substrate, comprising:
    forming a light conversion structure on a second base substrate, wherein the light conversion structure comprises at least a plurality of quantum dot structures;
    forming a plurality of extinction structures on a side of the light conversion structure away from the second substrate by a patterning process, wherein a first channel is formed between any two adjacent extinction structures; and
    forming a plurality of first optical structures on a side of the light conversion structure away from the second base substrate and in the plurality of first channels by a printing process;
  aligning the first substrate and the second substrate; and
  forming a filler portion between the first substrate and the second substrate,
  wherein the filler portion contains a material with a refractive index greater than that of a material of the first optical structure, and the extinction structure contains a light-absorbing material; and
  wherein orthographic projections of the plurality of light sources on the first base substrate at least partially overlap orthographic projections of the plurality of first optical structures on the first base substrate, an orthographic projection of the light conversion structure on the first base substrate at least partially overlaps the orthographic projections of the plurality of first optical structures on the first base substrate, and the orthographic projections of the plurality of first optical structures on the first base substrate fall within an orthographic projection of the filler portion on the first base substrate.

* * * * *